(12) United States Patent
Khandekar et al.

(10) Patent No.: US 6,567,904 B1
(45) Date of Patent: May 20, 2003

(54) METHOD AND APPARATUS FOR AUTOMATICALLY DETECTING WHETHER A MEMORY UNIT LOCATION IS UNPOPULATED OR POPULATED WITH SYNCHRONOUS OR ASYNCHRONOUS MEMORY DEVICES

(75) Inventors: Narendra Khandekar, Folsom, CA (US); Aniruddha Kundu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/581,378

(22) Filed: Dec. 29, 1995

(51) Int. Cl.[7] .................. G06F 12/00; G06F 13/00; G11C 11/407
(52) U.S. Cl. .................. 711/170; 711/5; 711/105; 711/167; 365/230.03; 365/233
(58) Field of Search .................. 395/405, 431, 395/432, 494, 497.01, 651; 365/230.03, 233; 711/5, 104, 105, 167, 170

(56) References Cited

U.S. PATENT DOCUMENTS

| 4,725,945 A | 2/1988 | Kronstadt et al. ......... 711/106 |
| 4,908,789 A | 3/1990 | Blokkum et al. ......... 711/172 |
| 4,937,791 A | 6/1990 | Steele et al. ......... 365/230.03 |
| 4,967,397 A | 10/1990 | Walck ......... 365/222 |
| 5,040,153 A | 8/1991 | Fung et al. ......... 365/230.03 |

(List continued on next page.)

FOREIGN PATENT DOCUMENTS

| EP | 0 281 999 | 3/1987 |
| EP | 0 440 445 A2 | 1/1990 |
| EP | 0 393 290 A1 | 10/1990 |
| GB | 2 226 666 A | 7/1990 |
| GB | 2 255 843 A | 11/1992 |

OTHER PUBLICATIONS

"Configurations for Solid State Memories," JEDEC Standard No. 21–C, Release 6, Jan. 1996, Electronic Industries Association Engineering Department.

(List continued on next page.)

Primary Examiner—Glenn Gossage
(74) Attorney, Agent, or Firm—Cynthia T. Faatz

(57) ABSTRACT

A memory controller apparatus and method for automatically detecting whether a particular memory unit location is unpopulated or populated with synchronous dynamic random access memories (DRAMs), or asynchronous fast page (FP) DRAMs or extended data out (EDO) DRAMs are disclosed. Logic in the memory controller detects a memory device type by writing a first data item to the memory device using at least a minimum common asynchronous memory write protocol meeting the write timing requirements of all asynchronous memory device types. An attempt is then made to read the first data from the memory device using a first asynchronous memory read protocol. If the first data is read from the memory device, the memory device is identified as being an asynchronous memory. If the first data is not read from the device, the memory control logic writes a second data item to the memory device using a synchronous memory write protocol. An attempt is then made to read the second data from the memory device using a synchronous memory read protocol. If the second data is read, the memory device is identified as being a synchronous memory device. If the second data is not read, the memory unit is unpopulated.

For one embodiment, the memory device type of each bank in a memory array is automatically stored in a configuration register such that a computer system is automatically configured to indicate memory device type.

16 Claims, 5 Drawing Sheets

U.S. PATENT DOCUMENTS

| | | | | |
|---|---|---|---|---|
| 5,175,835 | A | | 12/1992 | Beighe et al. .............. 711/212 |
| 5,237,672 | A | | 8/1993 | Ing-Simmons et al. ...... 711/211 |
| 5,269,010 | A | | 12/1993 | MacDonald .................... 711/5 |
| 5,276,843 | A | | 1/1994 | Tillinghast et al. .......... 711/105 |
| 5,301,278 | A | | 4/1994 | Bowater et al. ................ 711/5 |
| 5,307,320 | A | | 4/1994 | Farrer et al. ........... 365/230.01 |
| 5,457,659 | A | * | 10/1995 | Schaefer ................ 365/230.03 |
| 5,522,064 | A | * | 5/1996 | Aldereguia et al. ......... 711/167 |
| 5,526,320 | A | * | 6/1996 | Zagar et al. ............. 365/233.5 |
| 5,598,376 | A | * | 1/1997 | Merritt et al. ......... 365/230.06 |
| 5,610,864 | A | * | 3/1997 | Manning .................... 365/233 |
| 5,652,724 | A | * | 7/1997 | Manning .................... 365/233 |

OTHER PUBLICATIONS

"16Mbit Synchronous DRAM," NEC Corporation, Mar. 31, 1994.

"Single Chip PCI Bridge And Memory Controller For PowerPC™ Microprocessors," Michael J. Garcia, Brian K. Reynolds, Motorola Incorporated, 1993 IEEE, pp. 409–412.

"A New Era of Fast Dynamic RAMs," Fred Jones, United Memories, Inc., IEEE Spectrum Oct. 1992, pp. 43–45 and 48–49.

16–Mb Synchronous DRAM with 125/MByte/s Data Rate, Yunho Choi, Myungho Kim, et al., IEEE Journal of Soild–State Circuits, vol. 29, No. 4, Apr. 1994, pp. 529–533.

* cited by examiner

METHOD AND APPARATUS FOR AUTOMATICALLY DETECTING WHETHER A MEMORY UNIT LOCATION IS UNPOPULATED OR POPULATED WITH SYNCHRONOUS OR ASYNCHRONOUS MEMORY DEVICES

BACKGROUND OF THE INVENTION

1. Field of the Invention

The present invention relates to the field of computer systems. Specifically, the present invention relates to automatically detecting whether a memory unit is unpopulated or populated with synchronous or asynchronous memory devices.

2. Description of Related Art

Ease of use is an increasingly important goal in computer system design. For example, it is desirable for a computer system to be capable of automatically detecting changes in the computer system hardware, and configuring itself to work properly in response to detecting those changes. In this manner, computer system users do not have to perform complex set-up routines, or understand technical details relating to each aspect of their computer system. Further, automatic detection and integration capabilities provide computer system manufacturers with additional flexibility to more easily interchange hardware components, and to provide different system configurations without a requirement for significant design changes.

The computer system main memory array, for example, has many possible configurations due to the wide variety of memory device types and storage capacities available. Memory devices are frequently interchanged or added to the computer system main memory array to improve system performance or to run larger software programs. Further, computer system designers may vary the configuration of the main memory array in similar computer systems to meet desired price-performance targets. In this case, it is advantageous for the computer system designers or manufacturers to be able to use the same memory interface components independent of the types of memory devices in the memory array, while ensuring that the computer system takes advantage of the performance capabilities of higher performance memory.

Main memory arrays are typically formed of dynamic random access memories (DRAMs) arranged in rows or groups referred to herein as "memory units". The term "memory unit location" is used herein to refer to the physical location of a memory unit or an area which is configured to receive memory devices for the main memory array, but is unpopulated. Several different types of DRAMs are now available including well-known asynchronous DRAMs such as fast page mode (FP) and extended data out (EDO) DRAMs. Automatic memory device type detection and integration for such asynchronous DRAMs is the subject of a copending application entitled "A Method and Apparatus for Integrating and Determining Whether a Memory Subsystem is Installed with Standard Page Mode Memory or an Extended Data Out Memory", Ser. No. 08/348,365, filed Nov. 30, 1994 and assigned to the assignee of the present invention now abandoned in favor of continuation application Ser. No. 08/821,705, filed Mar. 19, 1997.

Also available is one of the newest types of DRAMs referred to as synchronous DRAM or SDRAM. SDRAM devices provide a significant increase in performance over EDO and FP DRAMs due to their memory access timing characteristics, but are also more expensive than the above-mentioned asynchronous devices.

Due to the increasing complexity of software applications as well as the demand by computer system users for higher performance machines, it is desirable for computer systems to be able to reliably integrate SDRAMs into the main memory array, either alone or in combination with other types of memory devices. Further, where SDRAM devices are used, it is important that the computer system is able to take advantage of the SDRAM performance benefits in order to provide a good return on the additional investment over lower performance asynchronous memory device types.

SDRAM devices require different memory access control signals and thus, a different memory interface than asynchronous DRAM devices. For this reason, some computer systems do not support operation with SDRAM devices in the main memory array.

Other computer systems may provide an interface for SDRAM memory accesses, but present other issues. For example, in some computer systems, the performance of the main memory array is limited by the lowest performance devices, such that there is no advantage to mixing high and low performance memory devices in the same memory array. In other computer systems, it is necessary for the computer system user to set hardware switches, or otherwise provide input to the computer system to indicate the types of memory devices in each row or memory unit of the main memory array. This approach can be problematic however, if the person setting the switches or providing the input to the computer system for configuration does not know what types of memory devices are installed in the computer system, or how to distinguish between the different types of memories available. In this case, the computer system may become unreliable if the hardware switches or other manual configuration mechanism is set incorrectly.

Thus, it is desirable to have a means for automatically detecting the type of memory devices in each memory unit location of the main memory array, including both asynchronous memory device types such as FP DRAMs and EDO DRAMs, as well as synchronous memory device types including SDRAMs. Further, it is desirable to be able to automatically configure the computer system such that the signals for performing memory accesses to each memory unit in the main memory array meet the timing requirements of the memory device type in each specific memory unit location for high performance memory accesses, whether the devices are synchronous or asynchronous.

SUMMARY OF THE INVENTION

A method and apparatus for automatically detecting the type of memory devices in a memory unit location, wherein the memory device type may be either asynchronous or synchronous, is disclosed. The memory device type is detected by writing a first data item to the memory device using at least a minimum common asynchronous memory write protocol meeting the write timing requirements of all asynchronous memory device types. An attempt is then made to read the first data from the memory device using a first asynchronous memory read protocol. If the first data is read from the memory device, the memory device is identified as being an asynchronous memory. If the first data is not read from the device, a second data item is written to the memory device using a synchronous memory write protocol. An attempt is then made to read the second data from the memory device using a synchronous memory read protocol. If the second data is read, the memory device is identified as being a synchronous memory device. If the second data is not read, the memory unit is unpopulated.

In one embodiment, a distinction is made between asynchronous fast page mode dynamic random access memories (FP DRAMs), asynchronous extended data out (EDO) DRAMs, synchronous DRAMs (SDRAMs) and unpopulated memory units, and the memory device type of each bank in a memory array is automatically stored in a configuration register such that the computer system is automatically configured to indicate memory device type.

BRIEF DESCRIPTION OF THE DRAWINGS

The invention is illustrated by way of example, and not by way of limitation in the accompanying drawings in which.

DETAILED DESCRIPTION OF THE INVENTION

The invention provides a method and apparatus for automatically detecting whether a memory unit location is unpopulated, or populated with synchronous DRAMs (SDRAMs), fast page mode (FP) DRAMs, or extended data out (EDO) DRAMs, and for automatically configuring a computer system to provide the required memory access signals to the memory unit based on the memory device type detected. In the following description, numerous specific details are set forth in order to provide a thorough understanding of the invention. However, it will be appreciated by those skilled in the art that the invention may be practiced without these specific details. In other instances, well-known elements have not been described in detail in order to avoid obscuring the invention.

Overview of the Computer System of One Embodiment

Figure 1:
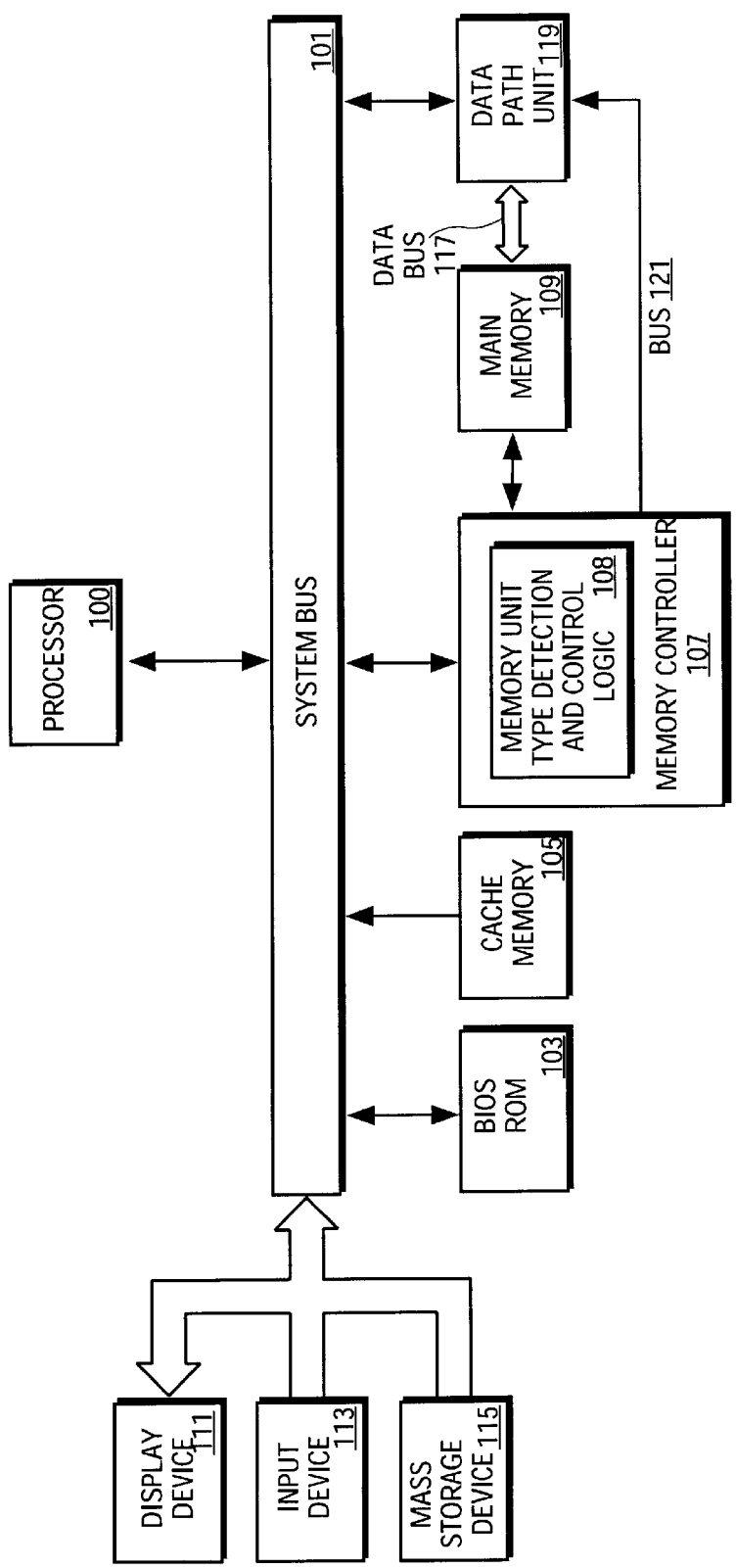
FIG. 1 is a block diagram illustrating a computer system in accordance with one embodiment of the present invention.

FIG. 1 is a block diagram illustrating a computer system in accordance with one embodiment of the invention. The computer system of the invention comprises a system bus 101 for communicating information, a processor 100 coupled to the bus 101 for processing information, and a cache memory 105 for storing frequently and/or recently used information for the processor 100. In one embodiment, the processor 100 is an Intel Architecture Microprocessor such as is manufactured by Intel Corporation of Santa Clara, Calif., the corporate assignee of the invention, however, other processor architectures may also be used in accordance with the invention. The cache memory 105 may be configured within the same integrated circuit device package as the processor 100 or within a separate integrated circuit device package.

The computer system of one embodiment also includes a read-only memory (ROM) 103, or other non-volatile storage device, for storing fixed information and instructions for the processor 100. The ROM 103 of one embodiment stores a basic input/output system (BIOS) program for initializing and configuring the computer system upon start-up or reset of the computer system. Also coupled to the system bus 101 is a display device 111 for displaying information to the computer system user, an input device 113, such as a keyboard and/or cursor control device, for communicating information and command selections to the processor 100, and a mass storage device 115 for storing data for the computer system.

A main memory 109 is coupled to the system bus 101 for storing information and instructions for the processor 100 during operation of the computer system. The main memory 109 includes one or more memory units, such as memory rows or memory banks, populated with memory devices. Each of the memory units within the main memory 109 is in a particular memory unit location and may include any one of a variety of different types of memory devices. Further, the main memory 109 may include one or more memory unit locations which are unpopulated. Additional details of the main memory 109 are discussed below with reference to FIG. 2.

A memory controller 107 is coupled to the system bus 101 and controls accesses (such as memory READ or WRITE operations) to the main memory 109 as well as memory refresh operations. The memory controller 107 of one embodiment includes memory unit type detection and control logic 108 which operates to automatically detect the type of memory devices, including both synchronous and asynchronous memory device types, in each of the memory unit locations of the main memory 109, as well as whether a particular memory unit location is unpopulated. Further, the memory unit type detection and control logic 108 of one embodiment, uses the detected memory device type information to automatically configure the computer system to provide the memory access control signals to each of the memory units to meet the timing and signal requirements unique to the detected memory device type. In alternate embodiments, the memory unit type detection and control logic 108 is integrated into another device within the computer system, or operates as a standalone integrated circuit.

In one embodiment, a data path unit 119 is also coupled to the system bus 101 and the main memory 109 and operates to control the flow of data to and from the main memory 109. In this manner, the address and data flows associated with the main memory 109 are separated to provide for efficient operation. The memory controller 107 and the data path unit 119 are coupled via the system bus 101, a data bus 117 to the main memory 109, and a bus 121 for communicating control signals. In alternate embodiments, the functionality of the memory controller 107 and the data path unit 119 are integrated into one integrated circuit component.

It will be appreciated by those of ordering skill in the art that other computer systems may be used in accordance with the invention. Similarly, it will be appreciated by those of ordering skill in the art that the computer system illustrated in FIG. 1 may include additional components not illustrated in FIG. 1, or may be configured without components that are illustrated in FIG. 1.

Memory Controller and Main Memory Arrangement of One Embodiment

Figure 2:
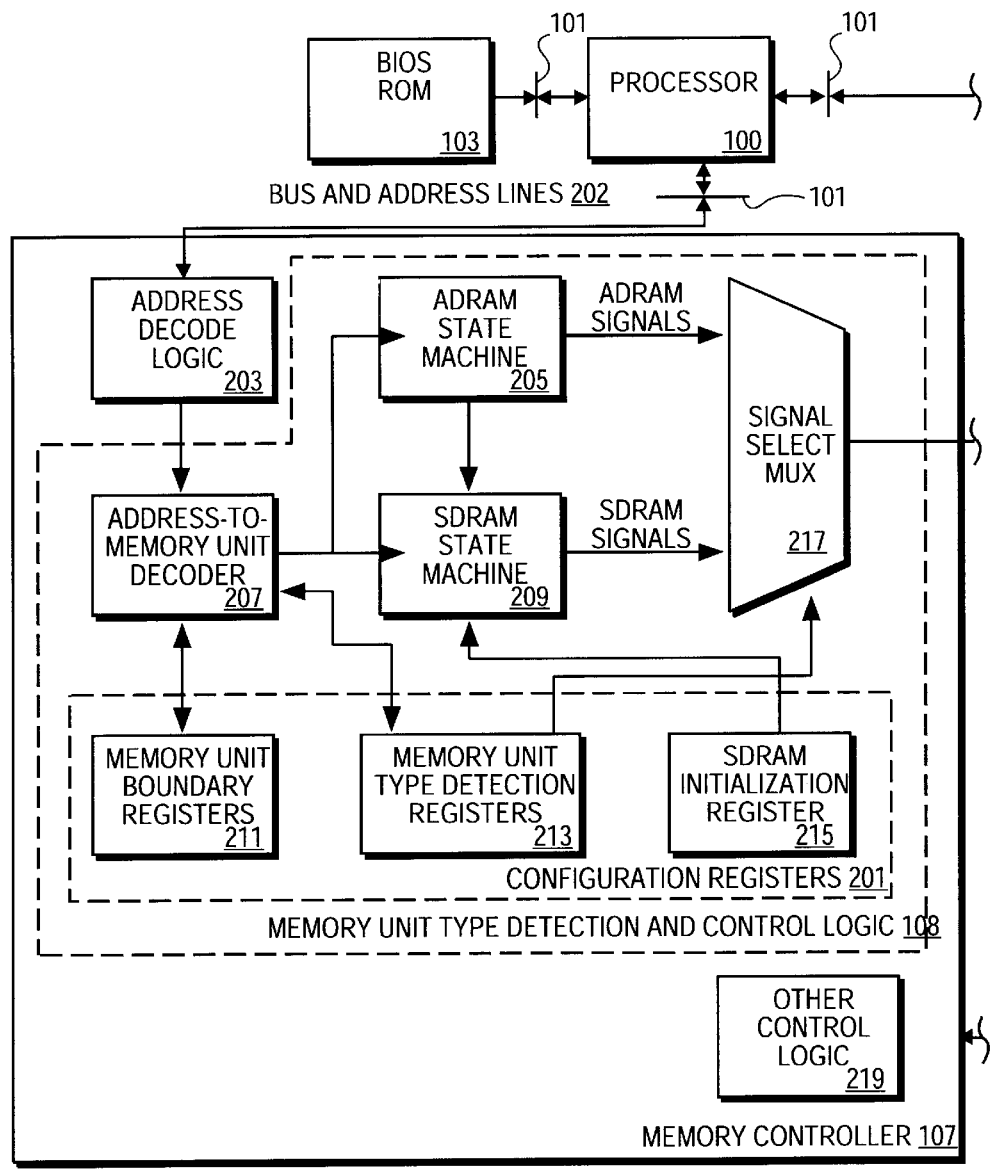
FIG. 2 is a block diagram illustrating the memory controller and main memory arrangement of one embodiment of the present invention.
Figure 2:
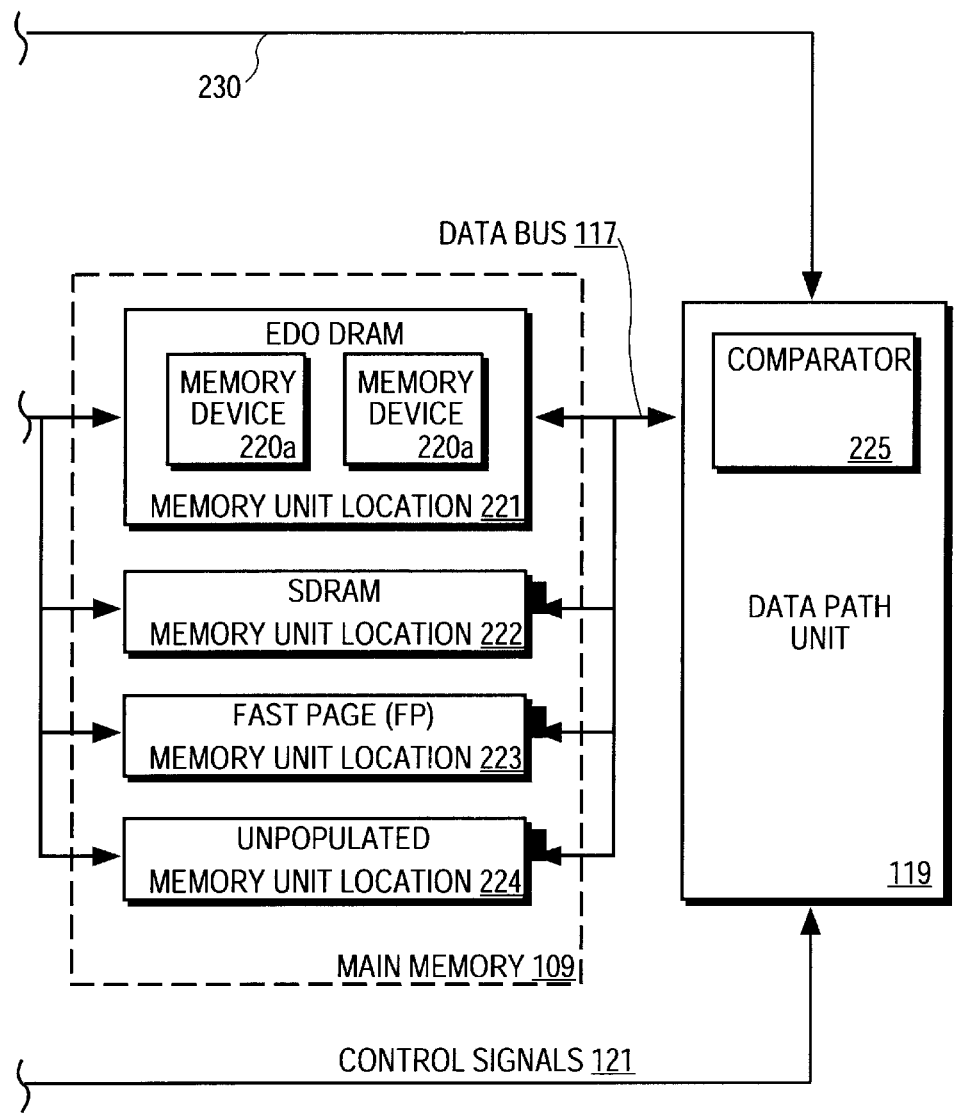

FIG. 2 illustrates the memory controller and main memory arrangement of one embodiment of the invention. Although the invention is described with reference to a main memory array including particular types and numbers of memory devices, it will be appreciated by those of ordinary skill in the art that other memory arrays including different types and numbers of memory devices may also be used in accordance with the invention.

The Main Memory of One Example

The main memory 109 of FIG. 2 includes memory unit locations 221–224. The memory unit locations 221–224 correspond to memory array rows in FIG. 2, but may be arranged differently. Each of the memory unit locations in the main memory 109 is either unpopulated or includes one or more memory devices such as the memory devices 220A and 220B in the memory unit location 221. The memory devices 220A and 220B may be individual integrated circuit devices, or memory modules such as single in-line memory modules (SIMMs) or dual in-line memory modules (DIMMs).

In one embodiment, the main memory 109 is formed of DRAM devices which may be any one of a variety of different DRAM device types. Each different type of DRAM device is characterized by different protocols including timing requirements which must be met to ensure reliable data accesses, and to achieve maximum memory access performance levels for the particular type of memory device. Thus, it is important for proper operation and performance optimization of the computer memory subsystem to be able to accurately determine the type of memory devices in each of the memory unit locations 221–224 in order to provide the correct memory access signals to each of the memory units. The timing requirements specific to each of the different types of DRAM devices are available in data sheets from the individual DRAM manufacturers and well-known to those of ordinary skill in the art, and are not described in detail herein.

In the main memory array 109 of FIG. 2, the memory unit location 221 is populated with EDO DRAM memory devices, the memory unit location 222 is populated with SDRAM memory devices, the memory unit location 223 is populated with FP DRAM memory devices and the memory unit location 224 is unpopulated. All of the memory unit locations of the main memory 109 may include a single memory device type, or memory device types may be mixed in a different configuration in different examples.

The Memory Controller of One Embodiment

Still referring to FIG. 2, along with the memory unit type detection and control logic 108, the memory controller 107 of one embodiment includes address decode logic 203 for decoding access requests received from the processor 100, and other control logic 219 for performing other memory control functions which are not described in detail herein, such as management of a memory access request queue. The memory unit type detection and control logic 108 of one embodiment includes an address-to-memory unit decoder 207, configuration registers 201, asynchronous DRAM (ADRAM) and synchronous DRAM (SDRAM) state machines 205 and 209, and a signal select multiplexor (mux) 217.

The configuration registers 201 of one embodiment include memory unit boundary registers 211, memory unit type detection registers 213, and an SDRAM initialization register 215. Additional configuration registers storing different types of information may also be included in the configuration registers 201 of the invention.

The memory unit boundary registers 211 and the memory unit type detection registers 213 each include a register corresponding to each of the memory unit locations 221–224 in one embodiment. The memory unit boundary registers 211 store information indicating the storage capacity or memory address range (which indirectly indicates storage capacity) associated with a particular memory unit in a particular memory unit location. In one embodiment, information is stored in the memory unit boundary registers 211 in response to a memory sizing routine that is stored in the BIOS ROM 103, and automatically executed by the processor 100 upon power-up or restart of the computer system. In alternate embodiments, information is stored in the memory unit boundary registers 211 based on input provided by the computer system user, either via input to a configuration routine, or by setting hardware switches in the computer system.

Information stored in the memory unit type detection registers 213 indicates a memory device type associated with a memory unit in a particular memory unit location. In one embodiment, a binary code is used to indicate a particular memory device type. In the embodiment illustrated in FIG. 2, for example, there are four possible memory device "types" or states that can be associated with a particular memory unit location. The memory unit location may include 1) EDO DRAMs, 2) FP DRAMs, 3) SDRAMs, or 4) it may be an unpopulated memory unit location.

In this case, a two bit binary code is used including a bit referred to as an "EDO detect bit", and another bit referred to as an "SDRAM" detect bit. If one or the other of these bits is set, the memory device type is indicated by the particular bit that is set. If neither bit is set, the memory unit type detection register 213 indicates that the corresponding memory unit location includes FP DRAMs. In one embodiment, if both bits are set, the memory unit type detection register 213 indicates that the corresponding memory unit location is unpopulated. In another embodiment, unpopulated memory unit locations are detected during the memory size determination routine, and an unpopulated memory unit location is indicated by a null storage capacity or address range in the corresponding memory unit boundary register 211. It will be appreciated that other types of codes including a greater number of bits may be stored in the memory type detection registers 213 to indicate additional types of memory or to represent the same information in a different way.

The memory unit type detection registers 213 of the invention are used both in the memory type detection process prior to configuration, and also, to configure the computer system by indicating the memory device type associated with each of the memory unit locations once the memory type detection process is complete. As with the memory sizing routine, in one embodiment, the memory type detection process is controlled by a software routine stored in the BIOS ROM 103 that is executed when re-starting or powering up the computer system. In the memory type detection process of the invention, codes are stored in the memory unit type detection registers to indicate a presumed memory device type for a particular memory unit location. The SDRAM and ADRAM state machines (described below) are controlled based on the code stored in the memory type detection registers to generate memory access control signals according to the timing and signal requirements of the indicated memory device type. The type of memory devices populating a particular memory unit location is then determined by the particular timing requirements the devices are detected to have met as described in more detail below.

Once the memory device type is detected for each of the memory unit locations 221–224 of the main memory array, the memory unit type detection registers 213 are used to configure the computer system such that memory access control signals are provided to each of the memory unit locations based on the type of memory devices in that particular memory unit location. The computer system is configured by storing information indicating the memory device type of each of the memory unit locations, and whether the memory unit location is unpopulated in one embodiment, in the memory unit type detection register corresponding to that particular memory unit location. Further details of the memory type detection and configuration process are discussed below in reference to FIG. 3.

The memory unit type detection:and control logic 108 of one embodiment includes an asynchronous DRAM (ADRAM) state machine 205 and an SDRAM state machine 209 to control the respective memory access control signals. The required memory access control signals depend, not only on the type of memory device being accessed, but also on the state that the memory device is in. Such state machines are described in detail in a copending patent application assigned to Intel Corporation, the assignee of the invention, entitled "Memory Controller for Independently Supporting Synchronous and Asynchronous DRAM Memories," Ser. No. 08/767,853, filed Dec. 17, 1996, now U.S. Pat. No. 5,721,860, which is continuation of Ser. No. 08/248,301, filed May 24, 1994, now abandoned. The memory device states and state transitions for both asynchronous DRAM devices and SDRAM devices are well-known to those of ordinary skill in the art, and described in data sheets available from the individual DRAM manufacturers. The asynchronous DRAM state machine 205 and the SDRAM state machine 209 operate in conjunction with the configuration registers 201, the address-to-memory unit decoder 207 and the signal select mux 217 to provide memory access control signals to meet the memory access protocol requirements, including timing requirements of the particular types of memory devices in each of the memory unit locations 221–224. The term protocol is used herein to refer to both the types and timing of particular signals used when accessing a particular type of memory device.

The ADRAM state machine 205 includes one or more state machines which control the memory access control signals communicated to memory units identified as being populated with asynchronous DRAM devices. The ADRAM state machine 205 may include one state machine to control all memory access signals for any asynchronous memory devices in the main memory array 109, or the ADRAM state machine 205 may include more than one state machine such as a RAS# state machine and a CAS# state machine. Alternatively, the ADRAM state machine 205 may include one state machine to control memory access signals for accessing FP DRAM devices and one state machine for EDO DRAM devices.

The memory access control signals as well as the memory states of SDRAM devices are different than those of their ADRAM counterparts, as is well-known in the art. The SDRAM state machine 209, thus performs a similar function to the ADRAM state machine 205, but for memory units determined to be populated with SDRAM devices. The SDRAM state machine 209 may also include one or more state machines to control the memory access signals for accessing SDRAM devices. Further, in alternative embodiments, the functionalities of the ADRAM state machine 205 and the SDRAM state machine 209 are combined into an integrated state machine which controls memory access signals for both SDRAM and ADRAM devices detected in the main memory array 109.

As mentioned above, SDRAM devices require different memory access control signals than asynchronous DRAM devices, such as FP DRAMs and EDO DRAMs. For example, while accesses to asynchronous DRAM devices are controlled primarily by well-known RAS# and CAS# signals, SDRAM accesses are controlled by a chip select (CS#) signal and also by control signals, such as SDRAM RAS# (SRAS#) and SDRAM CAS# (SCAS#) which are not used at all in accessing asynchronous DRAM devices.

In one embodiment, the memory controller 107 includes a dedicated pin or signal line for each of the control signals unique to controlling SDRAM memory accesses, and a dedicated pin or signal line for each of the control signals unique to asynchronous DRAM memory accesses. In another embodiment, some of the output pins or signal lines of the memory controller 107 are multiplexed such that a smaller number of pins or external signal lines may be used to provide a memory interface for both synchronous and asynchronous memory devices. In embodiments in which signal lines or pins are multiplexed, the mux 217, controlled by the memory unit type detection registers 213 operates to select the appropriate control signals to route to the multiplexed pins or signal lines based on the type of memory devices populating the memory unit location being addressed.

Even in embodiments in which the memory access control signals or pins are not multiplexed, or in which the mux 217 is not included, the information stored in the memory unit type detection registers 213 determines the control signals and the timing of the control signals which are communicated from the state machines to a particular memory unit location. In one embodiment, once the particular memory unit being addressed is identified, the memory device type information stored in the memory unit type detection registers 213 for that particular unit determines whether the SDRAM state machine 209 or the ADRAM state machine 205 is activated, and which memory access protocol is to be followed (e.g. EDO or FP DRAM protocols and timings for asynchronous DRAMs). In another embodiment, both the ADRAM and SDRAM state machines produce memory access control signals for each memory access request received, and the output of either the SDRAM 209 or the ADRAM state machine 205 is selected through the mux 217.

In operation, the memory controller 107 receives an access request from the processor 100 over the bus 202 which includes memory address lines. The address decode logic 203 decodes the request to determine whether it is a main memory access request and, if so, communicates the address of the memory access request to the address-to-memory unit decoder 207. The address-to-memory unit decoder 207 determines which of the memory unit locations 221–224 is being accessed based on the memory storage capacity or memory address range information stored in the memory unit boundary registers 211. Further, in one embodiment, the decoder 207 determines the type of memory access being performed, such as a memory READ or a memory WRITE, and forwards the information to one or both of the state machines 205 and 209 such that the appropriate memory access control signals are generated.

Once it is determined which of the memory unit locations 221–224 is being accessed, the memory unit type information stored in the memory unit type detection registers 213 for the particular memory unit is used as a selection control mechanism in one embodiment to select the desired signals to be transmitted over the signal lines 230 to the memory unit being addressed, either through the mux 217 or directly from the state machines 205 or 209.

The data path unit 119 of one embodiment is responsible for the flow of data to and from the main memory 109 as discussed above. The data path unit 119 is coupled to the main memory 109 via a data bus 117 and to the processor 100 by a bus 230 and the system bus. The memory controller 107 and the data path unit 119 interoperate via control signals on the signal bus 121.

In one embodiment, in addition to providing the datapath from the system bus to the main memory 109, the data path unit 119 provides error checking and correction support for data on the bus and in the main memory array 109, and support for single clock cycle data transfer bursts. The data path unit 119 includes comparator logic 225 for comparing a known data item to a data item latched from a particular memory location. The data path unit 119 in some embodiments, also includes additional logic for controlling data transfers to and from memory including data path state machines, buffers and other control logic (not shown).

The memory controller 107 sends the control signals for the particular type of memory access operation being performed to the data path unit 119 over control signal bus 121. If the memory access operation received from the processor 100 over the bus 202 is a memory READ operation, the data stored in the memory location indicated by the operation is latched by the data path unit 119 and communicated to the processor over the data bus 230. If the memory access operation is a memory WRITE operation, the data to be written to the particular memory location indicated by the memory access operation is communicated to the data path 119 over the data bus 230 and then stored in the particular memory location indicated by the memory access operation.

The Method of One Embodiment of the Invention

Figure 3A:
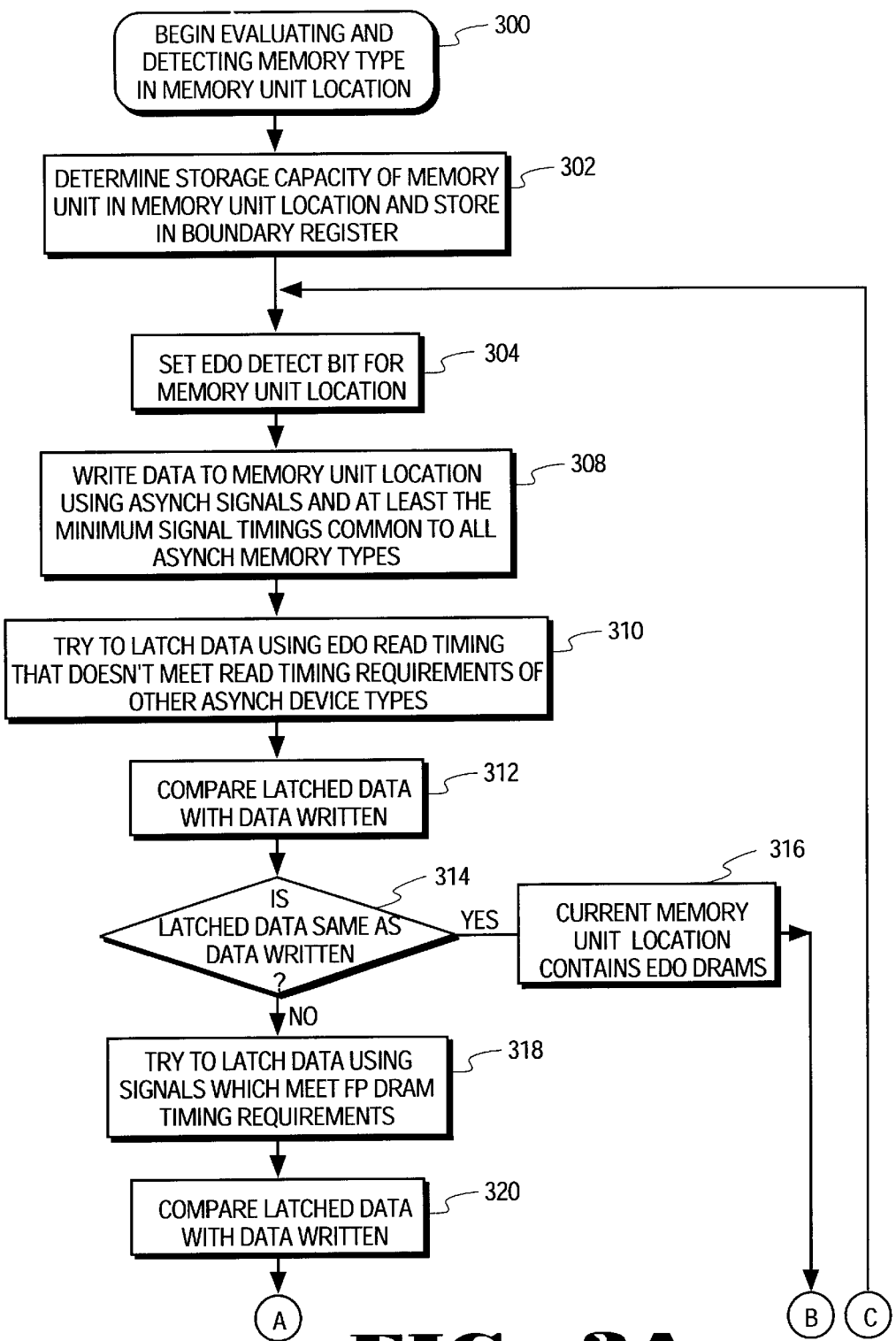
FIG. 3A is a first part of a flow diagram illustrating the memory device type detection and configuration method of one embodiment of the invention.
Figure 3B:
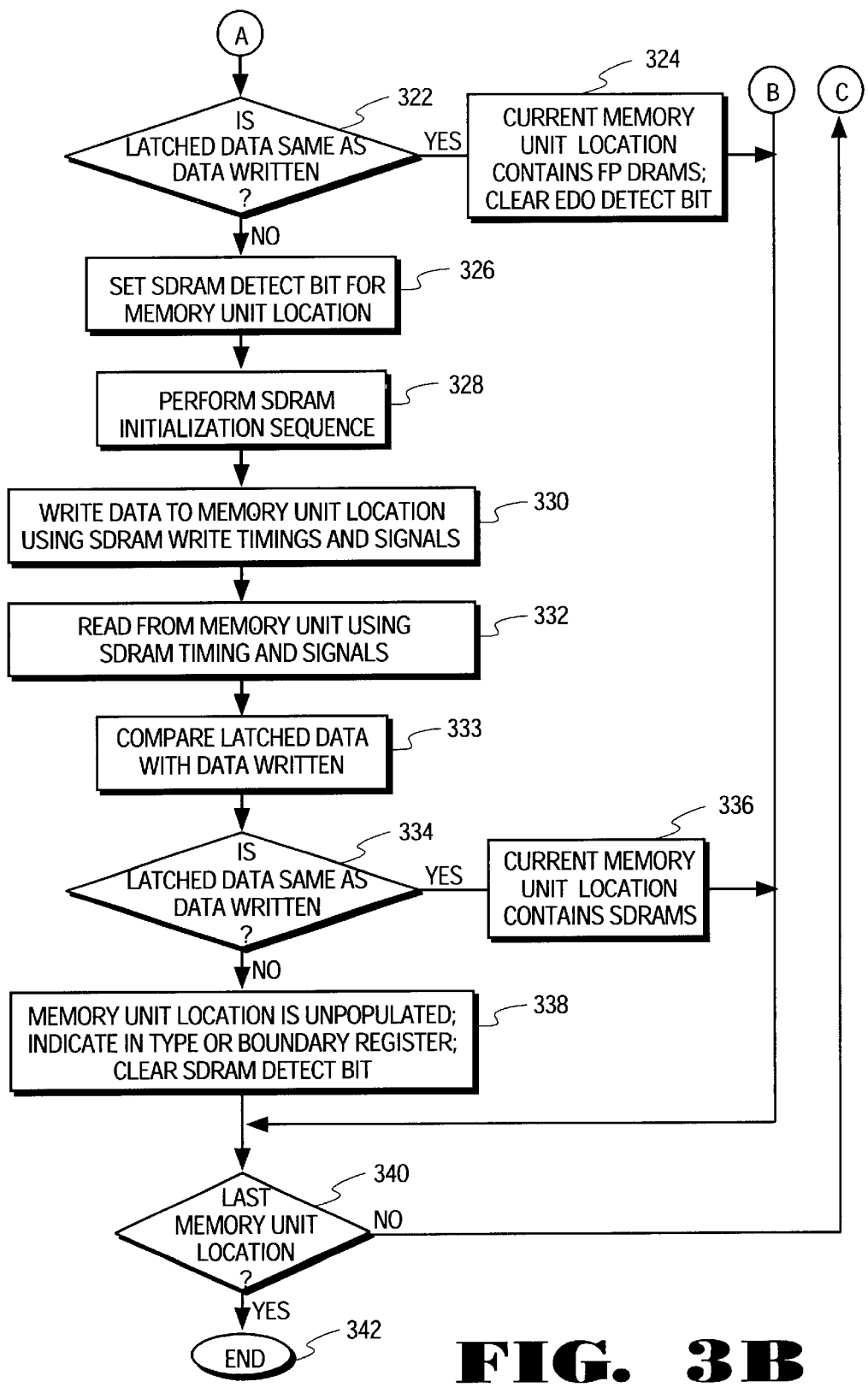
FIG. 3B is a second part of a flow diagram illustrating the memory device type detection and configuration method of one embodiment of the invention.

The memory device type detection and configuration method of the invention is described in detail with reference to FIGS. 3A and 3B. The method of the invention begins at step 300 and starts by evaluating a first memory unit location in the memory array. In processing block 302 in one embodiment, the computer system of the invention determines the storage capacity of the memory unit location being evaluated and stores memory address boundary information in a DRAM boundary register as discussed above. In one embodiment, this step includes a step of first setting the highest storage capacity, i.e. the storage capacity of the entire array, and then determining the storage capacity of each of the memory units as the process continues. If the memory unit location is not populated, the storage capacity and address range associated with the memory unit location are zero.

At step 304, the EDO detect bit in the memory unit type detection register corresponding to the particular memory unit location is set to indicate that the memory devices in the memory unit location are presumed first to be EDO DRAM devices. In step 308, the BIOS directs the memory controller to write a first data item to the memory unit using a memory write timing that will meet the memory write timing requirements for any of the asynchronous DRAM types potentially populating the memory unit—in other words at least a minimum common timing for all possible asynchronous DRAM device types. In one embodiment, the asynchronous DRAM device types include EDO DRAMs and FP DRAMs, and the memory write timing used to write the first data item to the memory unit is X-3-3-3, although a slower timing may also be used. The first number of the timing sequence given indicates the memory access time of the first byte of data in the memory line and depends on the particular signal from which it is referenced. The following numbers indicate a number of clock cycles from the previous memory access to the next access for the same line of memory. In alternate embodiments using different types of memory devices, a different timing may be used to write the first data item to the memory unit location.

In step 310, because the method starts off by presuming the memory unit is populated with EDO memory devices, an attempt is made to read the data from the memory unit location using an EDO READ timing that does not meet the READ timing requirements for any other asynchronous memory device type. In one embodiment, the column address strobe (CAS#) signal is deasserted, and a data latch control signal (one of the control signals 121 in FIG. 2), is asserted after a long interval (about 1 microsecond ($\mu$s) in one embodiment) in an attempt to read from the memory unit and latch the first data item. In step 312, the latched data is compared with the first data item by the comparator logic of the data path unit to determine if the latched data item and the first data item are the same. If the latched data and the first data item are the same in step 314, the memory unit is populated with EDO memory devices because the memory read and write timing signals above corresponding to EDO DRAM read and write timing signals are determined to have met the timing requirements of the memory devices in the memory unit. In step 316, the EDO detect bit in the memory type detection register for the memory unit which has already been set is left undisturbed and the method proceeds to step 340 (FIG. 3B). In this manner, the memory unit type detection register for the particular memory unit location is configured to provide the correct memory access control signals to the devices populating the memory unit location. In step 340, if there are more memory unit locations to be evaluated, the method returns to step 302 (FIG. 3A) to set the next memory unit location to the current memory unit location and continue the process. If the memory unit location just evaluated was the last memory unit location to be evaluated, the method of the invention ends at step 342 (FIG. 3B).

Referring back to decision block 314 (FIG. 3A), if the latched data is not the same as the first data item which the memory controller attempted to write to the memory unit, in step 318 another memory read operation is initiated by the BIOS, this time using asynchronous DRAM memory access control signals which meet the timing requirements of FP DRAMs. In one embodiment, the data latch signal (referred to as MADV# in one embodiment) is asserted simultaneously with the rising edge of the CAS# signal to meet the data read timing requirements for an FP DRAM in an attempt to latch the data which the memory controller attempted to write to the memory in the memory unit location. In step 320, the latched data is compared to the first data item, and in decision block 322 (FIG. 3B), if the latched data matches the first data item, the memory devices in the memory unit are determined to be FP DRAMs. In step 324, the EDO detect bit in the memory unit type detection registers is cleared to indicate that the memory unit includes FP DRAM devices. The method then continues at step 340 as described above. If this was the last memory unit location, the method ends at step 342, otherwise, the method returns to step 302 (FIG. 3A), where the next memory unit location is set to the current memory unit location and the process continues in step 304.

Referring back to decision block 322 (FIG. 3B), if the latched data does not match the first data item, the SDRAM detect bit in the memory type detection registers is set to indicate that the memory unit location is now presumed to include SDRAM memory devices in step 326. In step 328, the BIOS directs the memory controller to perform the SDRAM initialization sequence as indicated by the SDRAM initialization register. The SDRAM initialization sequence is indicated by a code stored in the SDRAM initialization register by the computer system or memory controller manufacturer, by the BIOS, or by a computer system user through manual input. In one embodiment, there is only one possible SDRAM initialization sequence and an SDRAM initialization register is not needed. In another embodiment, the particular SDRAM initialization sequence performed depends on the particular information stored in the SDRAM initialization register of the memory controller.

Once the SDRAM initialization sequence is complete, the BIOS directs the memory controller to try to write a second data item (which may be the same as the first data item) to the memory unit using SDRAM memory write timings and signals controlled by the SDRAM state machine in step 330. In step 332, the BIOS directs the memory controller to perform a read operation from the memory unit using SDRAM memory read timings and signals attempting to latch the second data item. In step 333, the latched data is compared with the second data item and at decision block 334, if the data is latched on the third clock signal after the read operation was initiated, the memory unit location is determined to be populated with SDRAM devices at step 336. If the memory unit is populated with SDRAM devices, the SDRAM detect bit remains set and the method proceeds to decision block 340, and terminates or continues as described above.

At step 334, if the correct data is not latched using the SDRAM timings, then the memory unit location is identified as being unpopulated in step 338. The method continues at decision block 340 which proceeds to step 302 (FIG. 3A) if additional memory unit locations remain to be evaluated or ends at step 342 (FIG. 3B) if the memory unit location was the last to be evaluated.

The invention provides several advantages including increased flexibility for system designers and original equipment manufacturers (OEMs) to provide a variety of different memory configurations including both synchronous and/or asynchronous memory devices, without requiring design changes or different memory interface components. Further, the invention provides for computer system users to more easily add to or replace memory devices in the main memory or other memory array in the computer system while ensuring that the memory device types in each of the memory unit locations is accurately detected and the computer system is configured to take full advantage of the memory device performance benefits.

Thus, a method and apparatus for determining whether a memory unit location is unpopulated or populated with asynchronous or synchronous memory devices is described. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

What is claimed is:

1. In a computer system including a memory unit, a method for determining whether the memory unit includes an asynchronous or synchronous memory device, the method comprising the steps of:

(a) writing first data to the memory unit using a first asynchronous memory write protocol;

(b) reading from the memory unit using a first asynchronous memory read protocol to attempt to latch the first data;

(c) identifying the memory device as a first asynchronous memory device type if the first data is latched;

(d) writing second data to the memory unit using a synchronous memory write protocol if the first data is not latched;

(e) reading from the memory unit using a synchronous memory read protocol to attempt to latch the second data; and (f) identifying the memory device as synchronous if the second data is latched.

2. The method as set forth in claim 1 further including a step of identifying the memory unit as being unpopulated if neither the first data nor the second data are latched following the identifying step (f).

3. The method as set forth in claim 1 wherein the asynchronous memory device is one of an extended data out (EDO) or page mode dynamic random access memory (DRAM), each having particular timing requirements, and wherein the first asynchronous memory write protocol meets timing requirements of both EDO and page mode DRAMs.

4. The method as set forth in claim 3 wherein the first asynchronous memory read protocol meets the EDO DRAM timing requirements, but not the page mode DRAM timing requirements, and the first asynchronous memory device type is EDO DRAM.

5. The method as set forth in claim 1 further including a step of reading from the memory unit using a second asynchronous memory read protocol following the step (c) of identifying the memory device as a first asynchronous memory device type if the first data is latched, wherein the second asynchronous memory read protocol meets the page mode DRAM timing requirements.

6. The method as set forth in claim 5 further including a step of identifying the memory device as page mode DRAM if the first data is latched when reading from the memory unit using the second asynchronous memory read protocol.

7. The method as set forth in claim 1 wherein the synchronous memory device is a synchronous DRAM (SDRAM).

8. The method as set forth in claim 7 further including a step of performing an SDRAM initialization sequence prior to the step (d) of writing second data if the first data is not read.

9. Memory control logic for automatically detecting which of a plurality of types of memory devices is installed in a memory unit in a computer system, the plurality of memory device types including an asynchronous and a synchronous memory device type, the memory control logic comprising;

a first state machine to write a first data item to the memory unit using a first asynchronous memory write protocol, the first state machine further to attempt to read the first data item from the memory unit using a first asynchronous memory read protocol;

a comparator coupled to the first state machine to compare data read by the first state machine to the first data item, the comparator to identify the memory device installed in the memory unit as an asynchronous memory device if the data read by the first state machine matches the first data item; and a second state machine coupled to the first state machine, the second state machine to write a second data item to the memory unit using a synchronous memory write protocol, the second state machine to attempt to read the second data item from the memory unit, the comparator to compare data read by the second state machine to the second data item, the comparator to identify the memory device installed in the memory unit as a synchronous memory device if the data read by the second state machine matches the second data item.

10. The memory control logic as set forth in claim 9 wherein the memory unit is identified as being unpopulated if the first data item and the second data item are not read correctly.

11. The memory control logic as set forth in claim 9 wherein the asynchronous memory device type includes extended data out (EDO) and page mode dynamic random access memories (DRAMs), each having particular memory access timing requirements, and wherein the synchronous memory device type includes synchronous dynamic random access memories (SDRAMs).

12. The memory control logic as set forth in claim 9 wherein the first asynchronous memory read protocol has a timing of X-3-3-3.

13. The memory control logic as set forth in claim 9 wherein the first asynchronous memory write protocol meets the timing requirements of both extended data out (EDO) and page mode dynamic random access memories (DRAMs).

14. The memory control logic as set forth in claim 13 wherein the first asynchronous memory read protocol meets the EDO DRAM timing requirements, but not the page mode DRAM timing requirements, and the first asynchronous memory device type is EDO DRAM.

15. The memory control logic as set forth in claim 14 the first state machine is further to read from the memory unit using a second asynchronous memory read protocol if the first data item is not read correctly using the first asynchronous memory read protocol, and wherein the second asynchronous memory read protocol meets the page mode DRAM timing requirements.

16. The memory control logic as set forth in claim 15 wherein the comparator identifies the memory device installed in the memory unit as page mode DRAM if data read from the memory device using the second asynchronous memory read protocol matches the first data item.

* * * * *

UNITED STATES PATENT AND TRADEMARK OFFICE
CERTIFICATE OF CORRECTION

PATENT NO. : 6,567,904 B1
DATED : May 20, 2003
INVENTOR(S) : Khandekar et al.

It is certified that error appears in the above-identified patent and that said Letters Patent is hereby corrected as shown below:

<u>Column 4,</u>
Lines 54 and 57, delete "ordering" and insert -- ordinary --.

<u>Column 7,</u>
Line 11, delete ":".

<u>Column 14,</u>
Line 20, immediately before the word, "page" insert -- a --.

Signed and Sealed this

Eleventh Day of May, 2004

JON W. DUDAS
*Acting Director of the United States Patent and Trademark Office*